United States Patent [19]

Mulholland et al.

[11] 4,364,620
[45] Dec. 21, 1982

[54] SOCKET FOR HOUSING A PLURALITY OF INTEGRATED CIRCUITS

[75] Inventors: Wayne A. Mulholland, Plano; Robert J. Martin, Dallas, both of Tex.; David S. Wilson, Fort Collins, Colo.; Carlos Esparza, Jr., Lewisville, Tex.

[73] Assignee: Mostek Corporation, Carrollton, Tex.

[21] Appl. No.: 261,236

[22] PCT Filed: Sep. 5, 1980

[86] PCT No.: PCT/US80/01139

§ 371 Date: Sep. 5, 1980

§ 102(e) Date: Sep. 5, 1980

[87] PCT Pub. No.: WO82/00923

PCT Pub. Date: Mar. 18, 1982

[51] Int. Cl.³ .............................................. H01R 13/00
[52] U.S. Cl. .............................. 339/17 CF; 339/112 R
[58] Field of Search ......... 339/17 CF, 112 R, 176 M, 339/176 MP

[56] References Cited

U.S. PATENT DOCUMENTS

| | | | |
|---|---|---|---|
| 3,555,364 | 1/1971 | Matcovich | 317/101 |
| 3,753,211 | 8/1973 | Pauza et al. | 339/75 MP |
| 3,757,284 | 4/1972 | Klehm, Jr. | 339/17 CF |
| 4,079,511 | 3/1978 | Grabbe | 29/627 |
| 4,080,026 | 3/1978 | Gianni | 339/17 CF |
| 4,192,565 | 3/1980 | Gianni | 339/17 CF |
| 4,224,637 | 9/1980 | Hargis | 357/74 |

Primary Examiner—Joseph H. McGlynn

[57] ABSTRACT

A socket (10) is described for housing similar integrated circuits (#1, #2). The socket (10) comprises a center support (14) which includes integral end panels (14a, 14b). The center support further includes a plurality of upstanding separators (42, 44) which form a plurality of recesses (46, 48). Side panels (18, 20) are joined to the center support to form first and second chambers (23, 24). A bottom plate (16) is connected to the center support (14) and side panels (18, 20). A lead frame (22) is positioned within the first and second chambers to provide metallic strips within the recesses (46, 48). In certain of the recesses the metallic strips extend from corresponding recesses in the two chambers (23, 24) and connect to a respective socket lead (12). In other selected recesses a metallic strip extends directly to connect to a package lead (12) such that there is no direct connection between common recesses. The integrated circuits (#1, #2) are positioned within the chambers (23, 24) such that the leads of the integrated circuits (#1, #2) are received within the recesses (46, 48). Certain leads of the devices (#1, #2) are connected in common to a socket lead (12) while other leads of the devices (#1, #2) are connected independently to socket leads (12) such that the two devices (#1, #2) can be operated independently.

10 Claims, 14 Drawing Figures

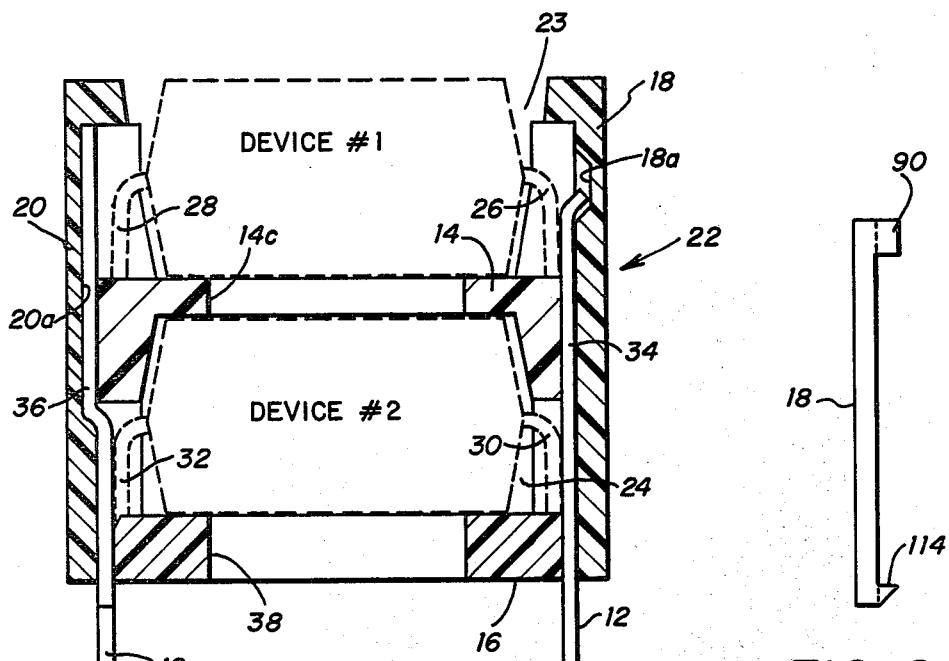
FIG. 2
FIG. 9
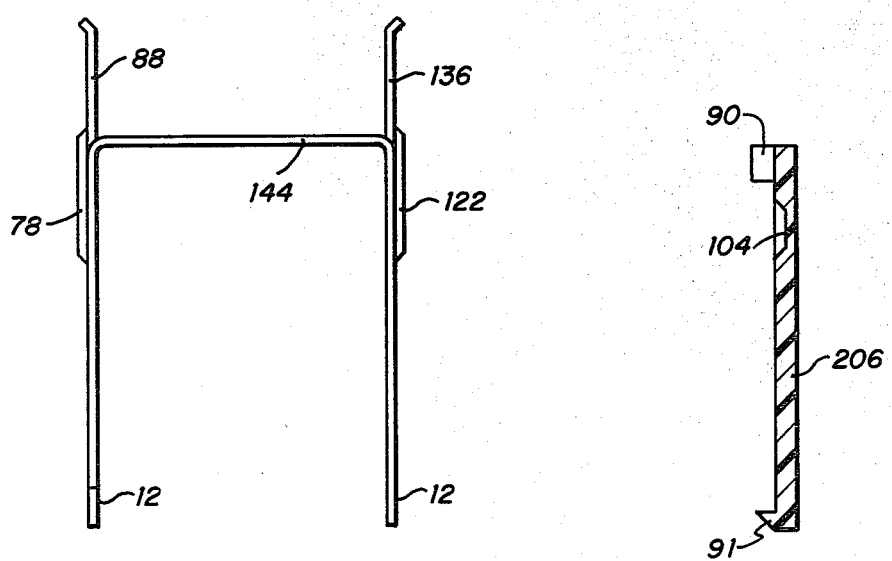
FIG. 11
FIG. 14

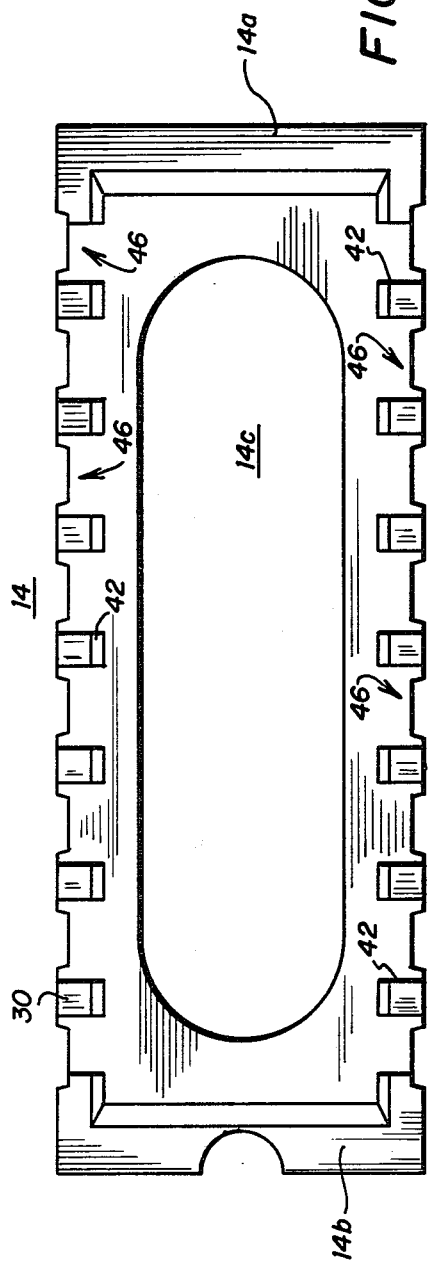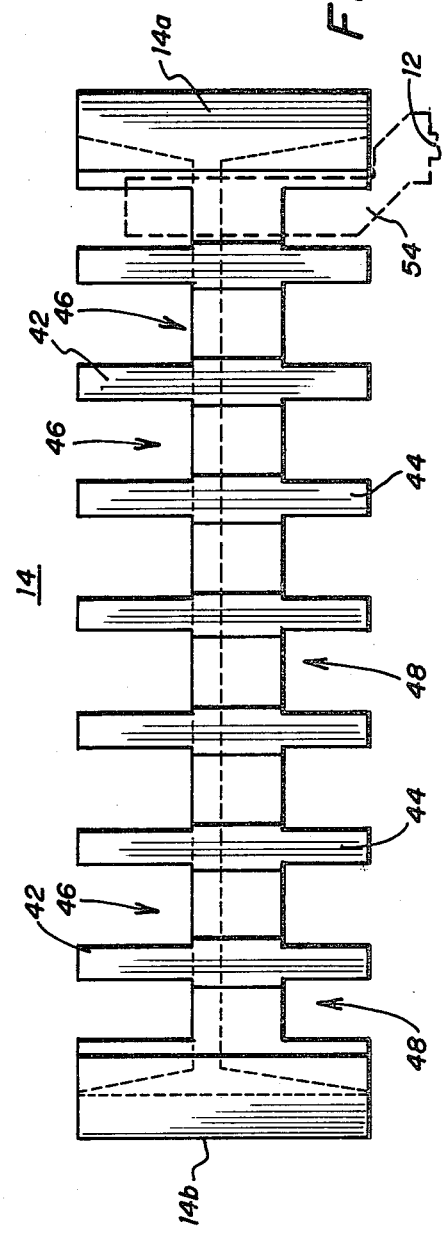

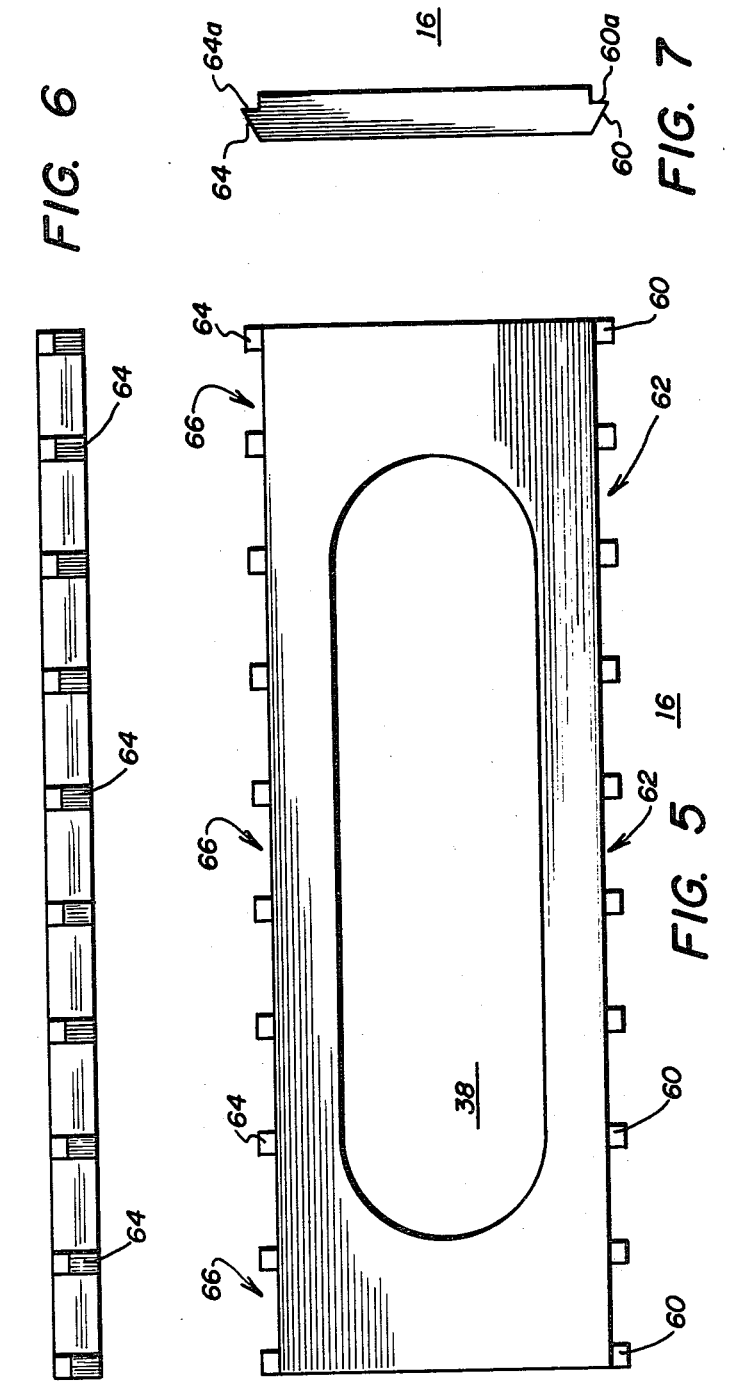

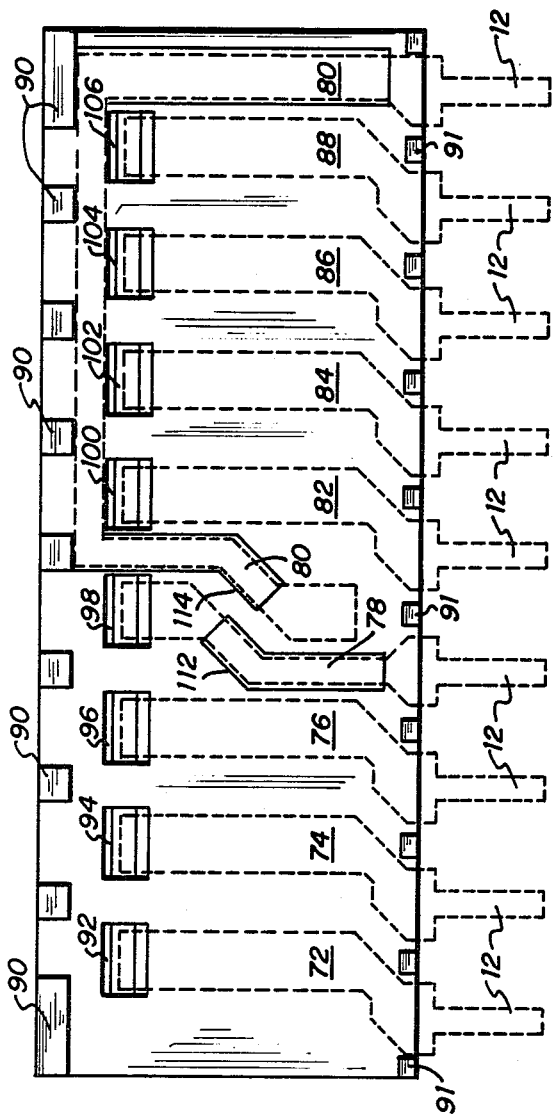

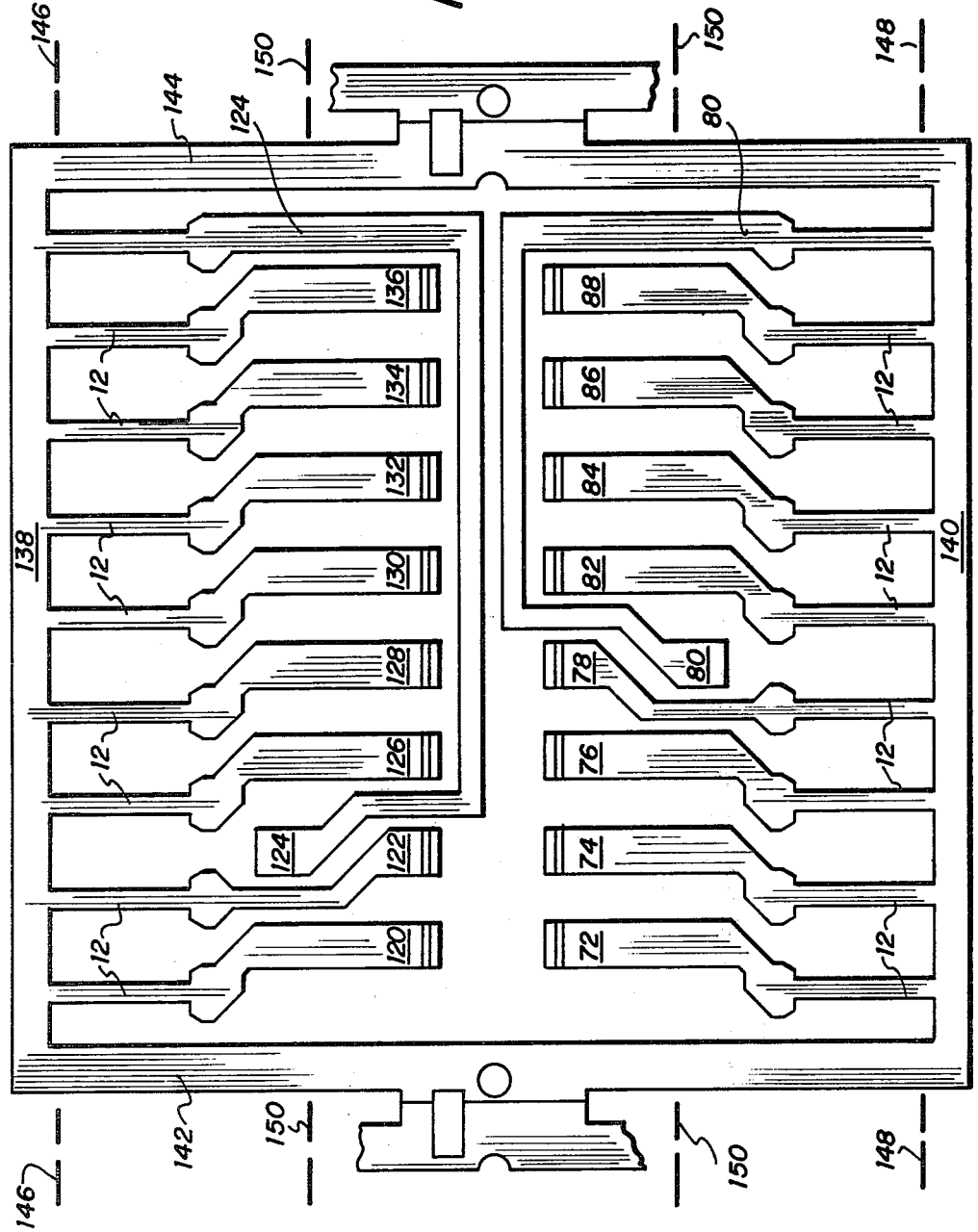

SOCKET FOR HOUSING A PLURALITY OF INTEGRATED CIRCUITS

TECHNICAL FIELD

The present invention pertains in general to integrated circuits and in particular to the packaging of such circuits.

BACKGROUND ART

There are numerous applications in which it is desirable to include more than one integrated circuit within a single socket. The standard 16K dynamic random access memory (RAM) now commonly in use has a 16 lead package. The addressing, control and power connections for the 16K RAM use all of the 16 leads such that larger memories require more leads. In certain applications there is a demand for a 32K dynamic RAM in a single package and a technique for producing such a product is to combine two 16K RAMS into a single package. This approach, however, has a number of drawbacks. Although certain of the signals transmitted to and received from the corresponding leads in the two memories are such that the corresponding leads can be connected together, certain of the leads must be connected independently to the control circuit for the memory so that each of the memories can be operated independently. Thus, it is not possible to use a single memory circuit design and simply connect all of the leads in common.

There are also applications which call for the combining of larger memories to produce units having memory sizes of 64K, 128K and larger. Further, there are applications for combining multiple integrated circuits such as microprocessors and memories in a single unit.

One existing approach for providing a double density memory as described above is the fabrication of non-standard memory circuits in which the circuits are designed specifically to have the majority of the physically corresponding leads connected in common and certain of the remaining leads connected to dedicated leads of the overall package. This technique permits the combining of two 16K random access memories each having a 16 lead package into a larger package having 18 leads. A primary drawback to this approach is the added expense required in fabricating parts dedicated for one specific application. If such parts do not meet the specific test requirements for the customer requiring the double density memory then the parts are typically not usable for conventional applications.

In view of these problems there exists a need for a package for housing a plurality of integrated circuits which are not uniquely fabricated for use in a combined configuration. Such a package can permit the grading of mass produced parts to select the desired grades for inclusion within the combined housing while using the other grades in conventional applications thereby eliminating the need for a unique circuit design and increasing the utilization of the circuits produced.

DISCLOSURE OF THE INVENTION

The present invention is a socket for containing at least two integrated circuits wherein the circuits are connected to operate independently through a plurality of package leads. Each of the integrated circuits is previously manufactured and encapsulated with a standard lead configuration. The socket includes a housing which has a planar member separating the interior of the housing into first and second square or rectangular chambers. A plurality of separator members are positioned adjacent opposed interior walls of the first and second chambers to form a plurality of recesses on the opposed walls of the chambers. A plurality of first metallic strips are included wherein each first metallic strip extends from within a recess in the first chamber through the plane of the planar member to within a corresponding recess in the second chamber and each first metallic strip is connected to a respective one of the package leads. The housing further includes a plurality of second metallic strips each one extending from within one of the recesses to connect to one of the package leads and the second metallic strips are located in corresponding recesses of the first and second chambers. Each of the first and second chambers is adapted to contain one of the integrated circuits wherein the leads of the integrated circuits are received into respective ones of the recesses in the corresponding chamber for contact with the metallic strips therein.

DETAILED DESCRIPTION OF THE DRAWINGS

For a more complete understanding of the present invention and the advantages thereof, reference is now made to the following Description taken in conjunction with the accompanying Drawings in which:

FIG. 2 is a sectional view of the semiconductor package shown in FIG. 1 together with devices which are included therein and a lead frame for providing the electrical connections to the devices;

FIG. 3 is an elevation view of the center support shown in FIGS. 1 and 2;

FIG. 4 is a plan view of the center support shown in FIG. 3;

FIG. 5 is a plan view of the bottom plate shown in FIG. 2;

FIG. 6 is an elevation view of the bottom plate shown in FIG. 5;

FIG. 7 is an end view of the bottom plate shown in FIG. 5;

FIG. 8 is an elevation view of the side panel which is shown in FIG. 2;

FIG. 9 is an end view of the side panel shown in FIG. 8;

FIG. 10 is a plan view of a stamped lead frame as used in the present invention within the package shown in FIG. 1;

FIG. 11 is an elevation view of the lead frame shown in FIG. 10 which has been formed in the required shape;

FIG. 13 is an elevation view of a side panel for use with the lead frame shown in FIG. 12; and FIG. 14 is a sectional view of the side panel shown in FIG. 13.

DETAILED DESCRIPTION

Figure 1:
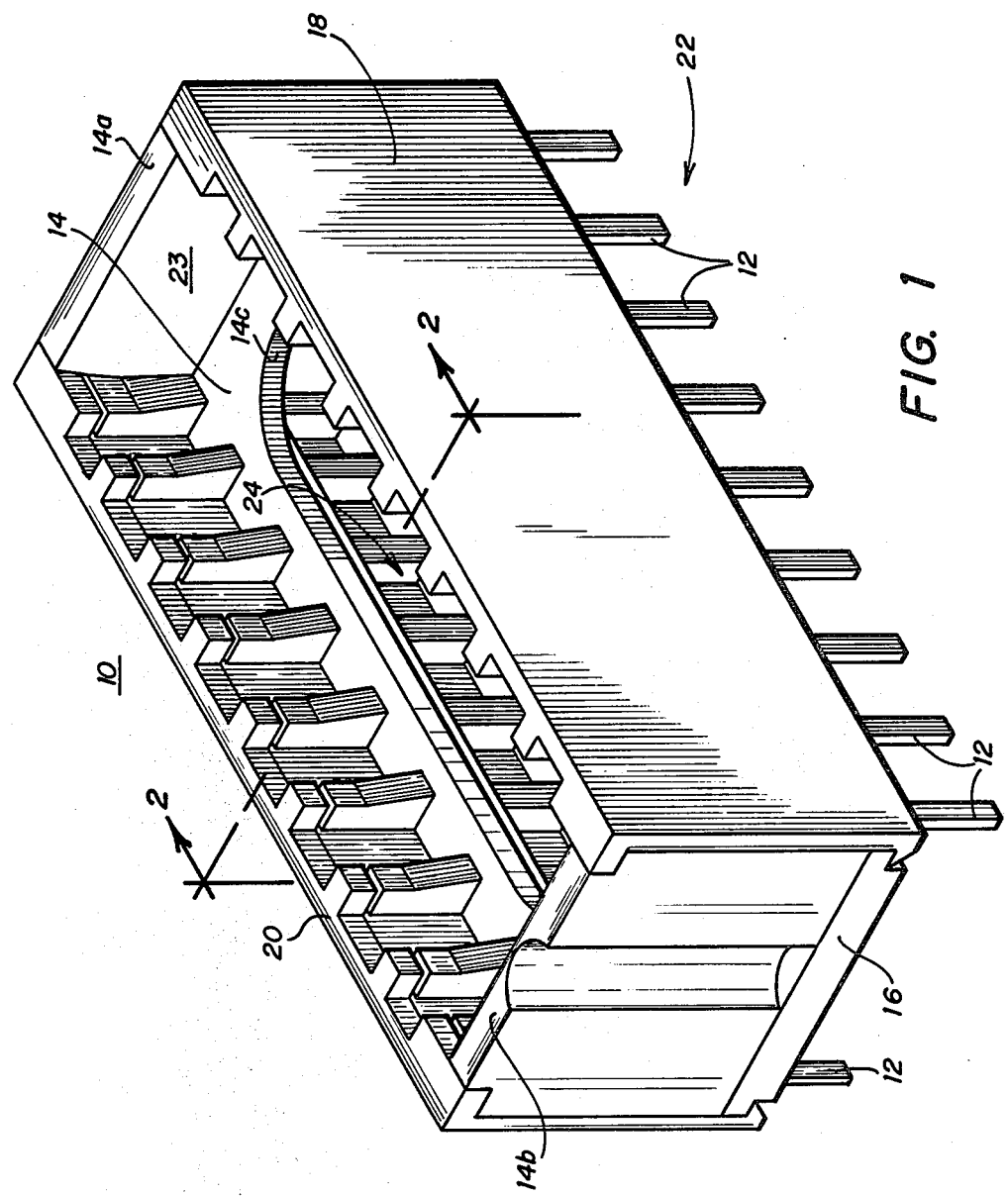
FIG. 1 is a perspective view of the semiconductor package of the present invention.

In the following descriptive material like reference numerals will be used throughout the various views to designate similar elements.

Referring to FIG. 1 there is shown a socket 10 which houses two similar, previously packaged, integrated circuits. The socket 10 is provided with 18 leads designated by the reference numerals 12. The 18 leads are arranged in a dual in-line configuration with 9 leads on each side to connect two 16 lead memory integrated circuit devices and produce a double density memory.

The socket 10 is designed to accommodate two 16 lead devices wherein the two devices are accessed through the 18 socket leads designated by numerals 12. The socket 10, in a preferred embodiment comprises five components. The first component is a center support 14 which is provided with integral end panels 14a and 14b. An opening 14c is provided in the middle of support 14 to permit air circulation to cool the two devices included within the socket and to allow access to the interior of the socket for cleaning.

A second element of socket 10 is a bottom plate 16 which serves as a support member for the socket and is also provided with a central opening also to permit the circulation of cooling air and access for cleaning.

The socket 10 is further provided with side panels 18 and 20 each of which is connected to the center support 14 and the bottom plate 16.

The center support 14, bottom plate 16, and side panels 18 and 20 are preferably fabricated of a thermoplastic material such as, for example RYTON, which is the trademark of such a plastic manufactured by Phillips Petroleum Company. A preferred material for such a plastic is a glass filled polycarbonate.

The socket 10 is preferably assembled by ultrasonically welding the center support 14 and side panels 18 and 20 while joining the bottom plate 16 by means of an interference or snap coupling.

The final element of the socket 10 is a lead frame 22 a portion of which is shown in FIG. 1 as the socket leads 12. Each of the elements of the socket 10 will be described below in further detail.

When the socket 10 is assembled it includes an upper chamber 23 and the lower chamber 24. A previously packaged semiconductor device is mounted within each of the chambers 23 and 24 and the leads of the devices are connected to the leads 12 such that both devices can be operated independently through the 18 leads of socket 10. Thus, by use of the socket 10, two 16 lead devices can be fully operated by use of the single 18 lead socket. In a typical application a completely packaged 16K random access memory (RAM) is mounted within each of the chambers 23 and 24. The two RAMS when used in conjunction provide effectively a 32K memory with a lead configuration having only two additional leads over a single density memory circuit.

The socket of the present invention provides greater flexibility in the use of a standard designed memory circuit. A particular random access memory device can be used either by itself in a conventional manner or combined with a similar device in the socket 10 to produce a double density memory in an 18 lead socket. The double density device can be produced without the need for fabricating different memory circuits to be included within the particular double density device. This reduces manufacturing, storage and distribution expenses as well as providing greater applications for a given circuit.

In a further application of socket 10 a microprocessor is mounted in one chamber and a memory device is mounted in the other chamber wherein the microprocessor works in conjunction with the memory device.

The various component parts of the socket 10 are now described to show the structure of each part and its relationship to the socket.

Referring now to FIG. 2 there is shown a cross-sectional view of the package 10 in which devices, integrated circuits, #1 and #2 have been installed respectively in chambers 23 and 24. Device #1 has leads 26 and 28 and device #2 has leads 30 and 32. The lead frame 22 is shown with fingers 34 and 36 which extend vertically from device #1 downward past the leads of device #2 to the socket leads 12. The fingers 34 and 36 are metallic strips. For operating devices #1 and #2 certain signals are provided in common to corresponding terminals of the two devices. Such leads are shown as 26 and 30 and are interconnected by finger 34. Certain control functions must be provided separately to the two devices and such an interconnection is shown between lead 32 of device #2 and finger 36. Lead 28 of device #1 is connected through a designated finger which is not shown in FIG. 2.

Note that the side plate 18 is provided with a recess 18a for receiving an outward bend of the finger 34. Likewise note that side panel 20 is provided with an extended recess 20a for receiving the vertical extension of finger 36 such that the finger 36 does not contact lead 28 of device #1.

The bottom plate 16 is shown connected to the center support 14 as well as the side panels 18 and 20. The plate 16 is provided with openings to allow the fingers 34 and 36 to pass therethrough and is further provided with a central opening 38 which permits the transfer of air through package 10 to cool the devices housed therein.

The center support 14 is further illustrated in FIGS. 3 and 4. Referring now to FIGS. 3 and 4 the center support 14 is provided with a plurality of upper separators 42 and lower separators 44. Each of the separators includes a portion which is tapered inward from the center toward the extremity of the separator. There are 14 separators provided on each side of the center support 14. These separators in conjunction with the end panels 14a and 14b provide 32 recesses or channels shown by reference numeral 46 for the upper side and reference numeral 48 for the lower side. The 16 recesses on each side of the center support 14 receive the respective 16 leads of devices #1 and #2.

Note in FIG. 3 that a finger 54 of the lead frame 22 is shown as it is oriented in regard to the center support 14. The finger 54 extends from one of the upper recesses 46 to one of the lower recesses 48 so that the common lead of devices #1 and #2 are both connected to finger 54 and thus to a common lead 12 of socket 10.

The bottom plate 16 of socket 10 is now described in reference to FIGS. 5, 6 and 7. The right hand side of plate 16 is provided with a group of ten tabs 60 which form nine recesses 62 between the tabs. The left hand side of plate 16 is similarly provided with a group of ten tabs 64 which form a group of nine recesses 66. The recesses 62 and 66 are provided to receive the nine downward extending leads 12 on either side of the socket 10.

The bottom plate 16 is illustrated in an elevation view in FIG. 6 and in an end view in FIG. 7. Note that the tabs 60 and 64 are tapered to form steps 60a and 64a. The steps formed in the tabs 60 and 64 provide a means for locking the bottom plate 16 to the side panels 18 and 20.

The side panel 18 of package 10 is illustrated in FIG. 8. The fingers of lead frame 22 are illustrated as reference numerals 72-88. Panel 18 is provided with a plurality of extensions 90 which align respectively with the separators 42 and end panels 14a and 14b of center support 14. The lower edge of panel 18 is provided with a series of tabs 91.

The upward end of each of the fingers 72-78 and 82-88 are bent outboard at an acute angle and are received into corresponding recesses 92-106 which are formed in side panel 18. The recesses 92-106 correspond to the recess 18a shown in FIG. 2.

Fingers 78 and 80 are provided to have separate connections to devices #1 and #2 rather than the common connections provided by fingers 72-76 and 82-88. A portion of the finger 78 is positioned within a recess 112 within side panel 18 to eliminate the possibility of contact between finger 78 and the adjacent fingers 76 and 80. A portion of the finger 80 is likewise positioned within a recess 114 within side panel 18.

The finger 80 is connected to the device #2 within chamber 24 and the metallic finger extends upward between fingers 78 and 82 and horizontally across to the end of panel 18 where the finger then drops downward to a socket lead 12. It is in this manner that the eight leads on one side of a 16 lead package are connected to the nine leads of the 18 lead socket 10 of the present invention. The configuration of the fingers and lead frame shown in FIG. 8 is provided to specifically connect a given lead of device #2 to a specific lead of socket 10. Other configurations, such as described below, can also be selected to provide specific lead connections for the leads of multiple devices which are not connected in common.

An end view of the side panel 18 shown in FIG. 8 is illustrated in FIG. 9. On the lower side of panel 18 there is included a set of tabs 114 which are tapered to provide means for locking the side panel 18 to the bottom plate 16.

The side panel 20 is essentially similar to the side panel 18 described above but shaped to receive the appropriate connecting fingers.

In an optional embodiment of the present invention the planar center support 14 is omitted from socket 10 which is otherwise the same as described above.

The lead frame 22 is illustrated as a flat stamping in FIG. 10. The fingers 72-88 are the same as those shown in FIG. 8. A second set of fingers 120-136 are included for the second side of the dual in-line package. Note that the pads for fingers 122 and 124 are vertically aligned so that one pad contacts a given lead for device #1 and the other pad contacts the corresponding lead for device #2. The remainder of the fingers in this group contact the corresponding leads on both of the devices in common. Finger 124 has an extension which runs along fingers 126-136 and drops down to connect to a corresponding lead 12. The lead frame 22 is included within a stamping which includes outboard strips 138 and 140 and end strips 142 and 144. After lead frame 22 has been shaped and inserted within the package 10 the frame is cut along trim lines 146 and 148 to eliminate the outboard and end strips thereby isolating each of the fingers leaving each finger connected only to the lead or leads of devices #1 and #2. The end strips 142 and 144 are folded along lines 150 to provide the appropriate spacing and positioning of the fingers for insertion into the socket 10.

The lead frame 22 is further illustrated in the folded configuration in FIG. 11. When the end sections 142 and 144 have been bent as shown in FIG. 11 the two groups of fingers 72-88 and 120-136 are aligned in parallel offset rows. The upper, free ends of the fingers are each bent at an acute angle in the outboard direction. The ends of the fingers 80 and 124 are not bent in this manner. Note that the fingers 78 and 122 are offset outward away from the center line of fingers 88 and 136.

As noted above the lead frame configuration shown in FIG. 10 is designed to connect specific terminals of the devices included within socket 10. The lead frame configuration is adaptable to almost any pin configuration to provide interconnections between selected leads of the devices and the leads of socket 10.

Figure 12:
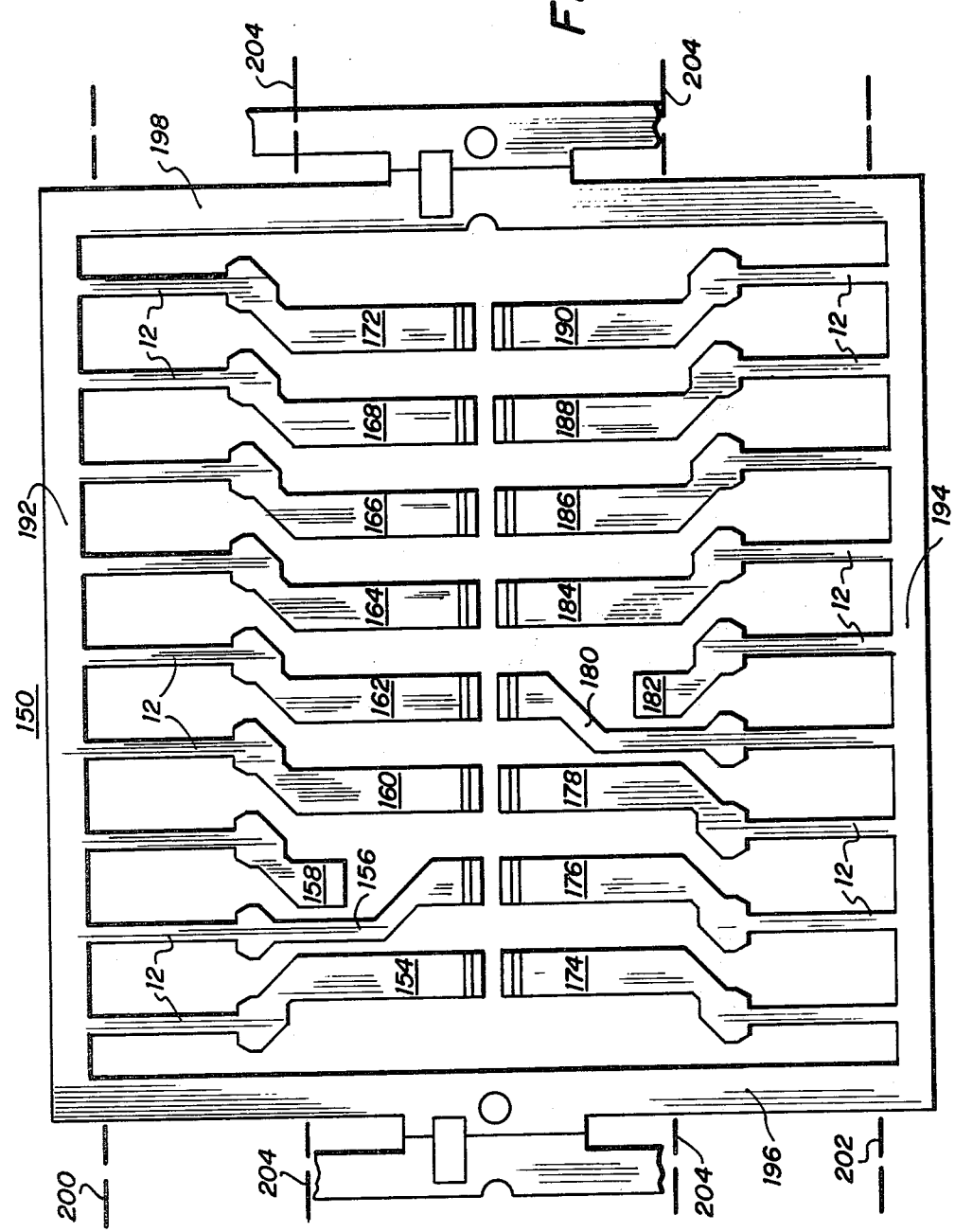
FIG. 12 is a plan view of an alternative embodiment of a stamping for a lead frame for use in the present invention.

A further lead frame configuration 150 is illustrated in FIG. 12. This is also shown as a stamping which is an economical method for producing the lead frame of the present invention. The lead frame 150 is provided with a first set of nine fingers 154-172. Note that the pads for fingers 156 and 158 are vertically offset such that the common leads of the two devices are connected to separate leads 12 of the socket 10. The lead frame 150 is provided with a second set of nine fingers 174-190 in which the pads of fingers 180 and 182 are vertically offset for isolated connection of each of the fingers to common leads of devices #1 and #2 within the socket 10.

The lead frame 150 also includes outboard strips 192 and 194 and end strips 196 and 198 which are separated from the fingers when the lead frame is trimmed along lines 200 and 202. In order to shape the lead frame 150 the end sections 196 and 198 are folded along lines 204 to produce a lead frame configuration similar to that shown in FIG. 11. Note also that the ends of each of the fingers, other than 158 and 182 are bent at an acute angle in the outboard direction to enable the leads of the devices to be more easily inserted into the package. In a similar manner the fingers 156 and 180 have a portion thereof offset from the plane of the remaining fingers into the side panels in order to prevent contact with the adjacent fingers.

A side panel 206 for use with the lead frame 150 is illustrated in FIG. 13. The side panel 206 is quite similar to the side panel 18 shown in FIG. 8 with provision made for the differing lead frame configuration of the lead frame 150. The side panel 206 is provided with a recess 208 for receiving the finger 156 which is offset from the plane of the remaining fingers in that group.

A section view of the side panel 206 is illustrated in FIG. 14. The recess 104 receives the outward bent upper end of finger 168. The tab 91 on the lower side of panel 206 is provided with a taper for locking the side panel to the bottom plate 16.

An optional technique for producing the socket 10 is to place a lead frame in a mold cavity and mold plastic around the lead frame to produce the socket 10 in one step as contrasted with the assembly of the individual elements described above.

In summary, the present invention comprises a socket for housing a plurality of integrated circuits which are connected to operate independently through a set of socket leads. Selected corresponding terminals of the integrated circuits included within the socket are connected directly together to a respective lead of the socket. Leads of the integrated circuits which must be connected separately are connected through metallic strips which extend from the circuit leads directly to a respective one of the socket leads. The socket of the present invention thus enables the combining of identical memory circuits into a double density configuration without the need for customizing any of the integrated circuits.

Although several embodiments of the invention have been illustrated in the accompanying drawings and described in the foregoing Detailed Description, it will be understood that the invention is not limited to the embodiments disclosed, but is capable of numerous rearrangements, modifications and substitutions without departing from the scope of the invention.

We claim:

1. A socket for containing at least two integrated circuits and for connecting said circuits to operate independently through a plurality of socket leads, each of said integrated circuits having a plurality of circuit leads extending therefrom, the socket comprising:
   a housing having first and second interior chambers;
   a plurality of separator members positioned adjacent opposed interior walls of said first and second chambers forming a plurality of recesses on the opposed walls of said chambers;
   a plurality of first metallic strips in which each first metallic strip extends from within a recess in said first chamber to within a corresponding recess in said second chamber, each first metallic strip in contact with a respective one of said socket leads;
   a plurality of second metallic strips each extending from within one of said recesses for contact with one of said socket leads, said second metallic strips located in corresponding recesses of said first and second chambers; and
   each of said chambers adapted to contain one of said integrated circuits wherein the leads of said integrated circuits are received in respective ones of said recesses for contact with the metallic strips therein.

2. The socket recited in claim 1 wherein said separator members are elongate and essentially parallel to the socket leads.

3. The socket recited in claim 1 wherein each combination of metallic strip and socket lead connected thereto comprises an integral metallic member.

4. The socket recited in claim 1 wherein the end of each of said metallic strips within the chamber opposite said socket leads is bent at an acute angle toward the adjacent outboard surface of said housing and the interior surface of said housing is provided with a depression for each metalic strip bent end for receiving said metallic strip bent ends therein.

5. The socket recited in claim 1 wherein at least a portion of each of said second metallic strips is recessed into the interior wall of said housing to offset the portion thereof from the plane of the adjacent metallic strips.

6. The socket recited in claim 1 including a planar member positioned within said housing and separating said first and second chambers.

7. The socket recited in claim 6 wherein said planar member is provided with a central opening to enhance air circulation through said housing and permit access for cleaning.

8. A socket for containing two integrated circuits and for connecting said circuits to operate independently through a plurality of socket leads, each of said integrated circuits having a plurality of circuit leads extending therefrom, the socket comprising:
   a center support including a central rectangular planar member;
   a plurality of separator members connected transversely to said planar member along two opposed edges thereof on each surface thereof, the separators on the surfaces of said planar member oriented in a mirror image arrangement;
   end panels joined to the remaining opposed edges of said planar member;
   a side panel for each side of said planar member having said separators connected thereto, each side panel extending from one of said end panels to the other of said end panels, each side panel contiguous the separators joined to the edge of the planar member corresponding to the side panel, said side panels enclosing said center support to form first and second chambers, one on each side of said planar member;
   a bottom plate extending between corresponding edges of said end panels and corresponding edges of said side panels;
   said separators forming a plurality of channels therebetween;
   a plurality of first metallic strips wherein each first metallic strip extends from within one of said channels in said first chamber to within a corresponding one of said channels in said second chamber, each of said first metallic strips connected to a respective one of said socket leads;
   a plurality of second metallic strips each extending from within one of said channels to connect to a respective one of said socket leads, said second metallic strips located within corresponding channels in said first and second chambers; and
   said metallic strips positioned within said channels adjacent the interior surfaces of said side panels to contact the leads of said integrated circuits when one of said circuits is positioned within said first chamber and one of said integrated circuits is positioned within said second chamber and the leads of said integrated circuits are received respectively in said channels.

9. The socket recited in claim 8 wherein said planar member and said bottom plate are each provided with central openings for enhancing air circulation through said socket and for providing access thereto.

10. The socket recited in claim 8 wherein at least a portion of each of said second metallic strips is recessed into the interior surface of the corresponding side panel.

* * * * *